(12) United States Patent
Joo

(10) Patent No.: US 8,183,140 B2
(45) Date of Patent: May 22, 2012

(54) SEMICONDUCTOR DEVICE AND METHOD OF FABRICATING THE SAME

(75) Inventor: Sung Joong Joo, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 337 days.

(21) Appl. No.: 12/560,900

(22) Filed: Sep. 16, 2009

(65) Prior Publication Data
US 2010/0074013 A1    Mar. 25, 2010

(30) Foreign Application Priority Data

Sep. 22, 2008  (KR) .................... 10-2008-0092600
Nov. 6, 2008   (KR) .................... 10-2008-0109772

(51) Int. Cl.
*H01L 21/28* (2006.01)
(52) U.S. Cl. .................................. 438/591; 257/E21.21
(58) Field of Classification Search .............. 257/324, 257/E21.21, E29.309, 257; 438/591, 195, 438/176
See application file for complete search history.

(56) References Cited

U.S. PATENT DOCUMENTS

| 5,869,861 A | * | 2/1999 | Chen ............................. 257/308 |
| 7,456,068 B2 | * | 11/2008 | Kavalieros et al. ........... 438/301 |
| 7,682,914 B2 | * | 3/2010 | Lo et al. ......................... 438/300 |
| 2006/0007741 A1 | * | 1/2006 | Yeh ............................. 365/185.18 |
| 2006/0154424 A1 | | 7/2006 | Yang et al. |
| 2007/0284650 A1 | * | 12/2007 | Willer ............................ 257/324 |
| 2008/0081450 A1 | * | 4/2008 | Lee ................................ 438/591 |
| 2011/0291177 A1 | * | 12/2011 | Lee et al. ....................... 257/324 |

FOREIGN PATENT DOCUMENTS

| KR | 10-2005-0046090 A | 5/2005 |
| KR | 10-2006-0002337 A | 1/2006 |

* cited by examiner

*Primary Examiner* — Thao P. Le
(74) *Attorney, Agent, or Firm* — Saliwanchik, Lloyd & Eisenschenk

(57) ABSTRACT

A method of fabricating a semiconductor device and a flash memory device are provided. The method of fabricating the semiconductor device includes: forming a nitride film on a semiconductor substrate; forming a sacrificial vertical structure on the nitride film; forming sacrificial spacers on lateral surfaces of the sacrificial vertical structure; performing an initial patterning of the nitride film using the sacrificial vertical structure and the sacrificial spacers as etch masks; removing the sacrificial spacers after the initial patterning of the nitride film and forming gate electrodes on the lateral surfaces of the sacrificial vertical structure; and removing the sacrificial vertical structure from between the gate electrodes and performing a secondary patterning of the nitride film using the gate electrodes as etch masks.

6 Claims, 5 Drawing Sheets

SEMICONDUCTOR DEVICE AND METHOD OF FABRICATING THE SAME

CROSS-REFERENCE TO RELATED APPLICATIONS

This application claims the benefit under 35 U.S.C. §119 of Korean Patent Application Nos. 10-2008-0092600, filed Sep. 22, 2008, and 10-2008-0109772, filed Nov. 6, 2008, which are hereby incorporated by reference in their entirety.

BACKGROUND

The present disclosure relates to a method of fabricating a semiconductor device, and a flash memory device and a method of driving the same.

With the development in information processing technology, high-integrated flash memory devices have been developed. In particular, flash memory devices having a Silicon-Oxide-Nitride-Oxide-Silicon (SONOS) structure have been developed.

Such flash memory devices may include a select transistor for preventing an over-erase. However, because the flash memory devices further include the select transistor, it can be difficult to obtain high integration.

BRIEF SUMMARY

A method of fabricating a semiconductor device is provided that can reduce the deviation between semiconductor devices. In addition, an embodiment of the present invention provides a flash memory device that can be highly integrated and a method of driving the same.

A method of fabricating a semiconductor device according to one embodiment includes: forming a nitride film on a semiconductor substrate; forming a sacrificial vertical structure on the nitride film; forming sacrificial spacers on lateral surfaces of the sacrificial vertical structure; performing an initial patterning of the nitride film using the sacrificial vertical structure and the sacrificial spacers as etching masks; removing the sacrificial spacers from the initially patterned nitride film and forming gate electrodes on the lateral surfaces of the sacrificial vertical structure; removing the sacrificial vertical structure from between the gate electrodes; and performing a second patterning of the nitride film using the gate electrodes as etching masks.

A flash memory device according to one embodiment includes a trap unit that is disposed on a semiconductor substrate to trap charges; a channel region that includes a first channel region corresponding to the trap unit and a second channel region adjacent to the first channel region; a source region and a drain region spaced apart with the channel region therebetween; and a gate electrode disposed on the first channel region and the second channel region of the channel region.

A method of driving a flash memory device according to one embodiment includes: programming memory cells by injecting hot electrons into the charge trap unit; and erasing the memory cells by injecting hot holes into the charge trap unit.

The flash memory device according to an embodiment includes a first channel region and a second channel region, and a single gate electrode disposed on the first channel region and the second channel region.

Therefore, the flash memory device according to an embodiment has a structure where the memory cell is coupled with a select transistor. Thereby, the flash memory device can reduce over-erase.

Further, the flash memory device according to an embodiment uses one gate electrode to enable to drive the select transistor and the memory cell, and has improved integration.

Moreover, the flash memory device according to an embodiment can program and erase the memory cells by injecting hot electrons and hot holes into the charge trap unit. Therefore, the flash memory device according to the embodiment can be driven in a NOR form and thus, can be highly integrated.

In addition, the method of fabricating the semiconductor device according to an embodiment patterns the nitride film using the sacrificial vertical structure and the sacrificial spacers. The sacrificial spacers are formed by an etch back process so that the sacrificial spacers can be formed in the same size, the sacrificial spacers being symmetrical with each other.

According to an embodiment, the nitride film is patterned using the sacrificial spacers as masks so that the nitride film can be divided into two portions having the same width in a subsequent patterning process.

Therefore, two semiconductor devices can be formed from the two portions of patterned nitride film. At this time, the deviation between the two semiconductor devices is reduced.

By using symmetrical sacrificial spacers, the method of fabricating the semiconductor device according to an embodiment reduces the deviation between the devices.

In addition, each of the two devices includes a first channel region and a second channel region, with a corresponding gate electrode thereon.

Accordingly, the two devices each has a structure where a memory cell is coupled with a select transistor. Thereby, the flash memory devices can reduce over-erase.

Moreover, the flash memory device can use the one gate electrode to enable to drive the select transistor component and the memory cell component, improving integration.

DETAILED DESCRIPTION

Figure 1:
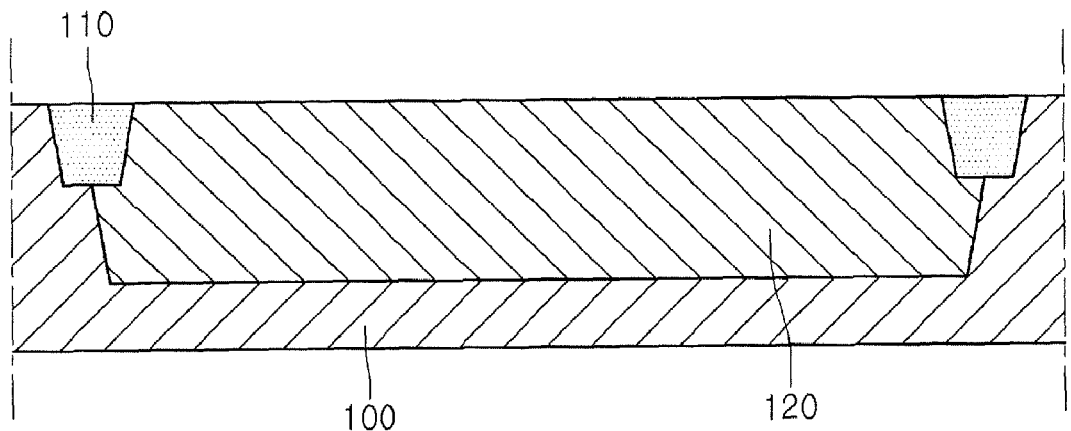
FIGS. 1 to 7 are cross-sectional views showing processes of a method of fabricating a flash memory device having a SONOS structure according to an embodiment.

When the terms "on" or "over" are used herein, when referring to layers, regions, patterns, or structures, it is understood that the layer, region, pattern or structure can be directly on and in contact with another layer or structure, or intervening layers, regions, patterns, or structures may also be present. When the terms "under" or "below" are used herein, when referring to layers, regions, patterns, or structures, it is understood that the layer, region, pattern or structure can be directly under and in contact with the other layer or structure, or intervening layers, regions, patterns, or structures may also be present. Also, being "on" or "under" each layer will be described based on the drawings. In the drawings, the thickness or size of each layer may be exaggerated, omitted or schematically illustrated for the convenience and clarity of explanation. Also, the size of each element in the figures does not completely reflect its actual size.

FIGS. 1 to 7 are cross-sectional views showing processes of a method of fabricating a flash memory device having a SONOS structure according to an embodiment.

Referring to FIG. 1, a device isolating layer 110 is formed on a semiconductor substrate 100, and an activation region is defined by a region between the device isolating layer 110. Thereafter, a low-concentration n-type impurity is implanted to the activation region, thereby forming an n-type well 120.

Figure 2:
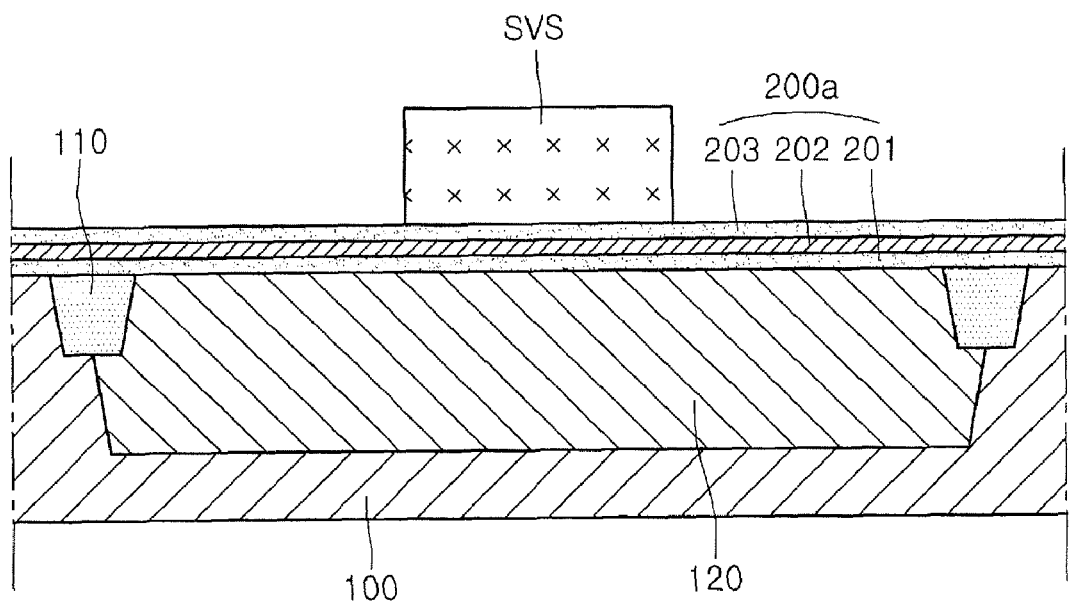

Referring to FIG. 2, after the n-type well 120 is formed, a tunnel oxide film 201, a nitride film 202, and a buffer layer 203 are formed on the semiconductor substrate 100.

In one embodiment, tunnel oxide film 201 is formed at a thickness of about 50 to 80 Å by a thermal oxidation process, and the nitride film 202 is formed at a thickness of about 70 to 100 Å by a chemical vapor deposition (CVD) process. The nitride film 202 may be made of silicon nitride (SiNx) by way of example.

The buffer layer 203 is formed on the nitride film 202. The buffer layer 203 may be made of silicon oxide (SiOx) by way of example.

Moreover, high-K material such as aluminum oxide may be deposited between the tunnel oxide film 201 and the nitride film 202.

Thereby, an ONO film 200a having a structure of oxide film-nitride film-oxide film is formed on the semiconductor substrate 100. At this time, the ONO film 200a may be patterned by a mask process.

For example, referring to FIG. 2, a sacrificial vertical structure (SVS) is formed on the buffer layer 203. The sacrificial vertical structure (SVS) may be made of, for example, nitride or oxide.

According to an embodiment, the sacrificial vertical structure (SVS) may be formed to have a height of about 3000 to 4000 Å.

Figure 3:
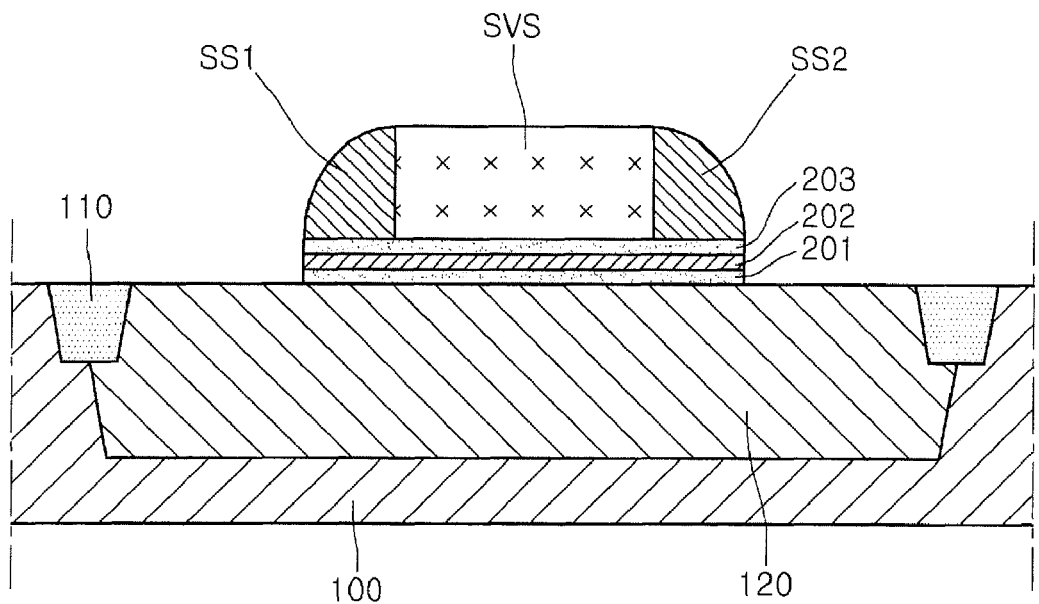

Referring to FIG. 3, after the sacrificial vertical structure (SVS) is formed, a silicon nitride layer is formed on the semiconductor substrate 100 and the silicon nitride layer is etched by an anisotropic etching process such as an etch-back process.

Therefore, first and second sacrificial spacers SS1 and SS2 are formed on the lateral surfaces of the sacrificial vertical structure (SVS). The first and second sacrificial spacers SS1 and SS2 are symmetrical with each other, having the sacrificial vertical structure (SVS) therebetween.

The first and second sacrificial spacers SS1 and SS2 are formed by the anisotropic etching process so that the first and second sacrificial spacers SS1 and SS2 have substantially the same size. More specifically, the bottom surfaces of the first and second sacrificial spacers SS1 and SS2 have the same width.

Thereafter, the ONO film 200a is patterned using the first and second sacrificial spacers SS1 and SS2 and the sacrificial vertical structure (SVS) as an etch mask. In other words, the portions of the ONO film 200a, where the first and second sacrificial spacers SS1 and SS2 and the sacrificial vertical structure (SVS) are not disposed, are etched.

Figure 4:
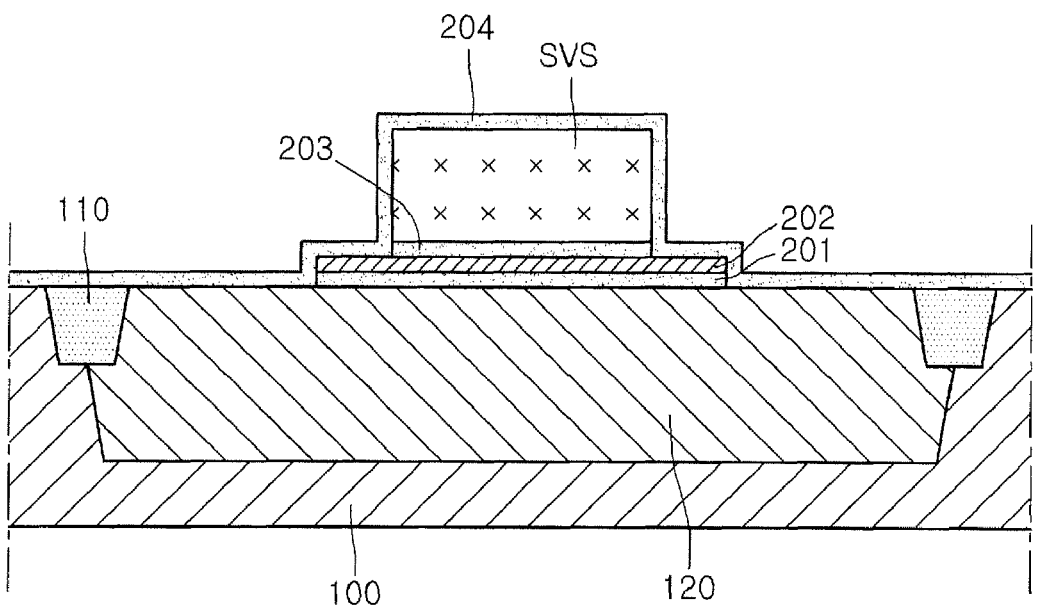

Referring to FIG. 4, the first and second sacrificial spacers SS1 and SS2 are removed. At this time, the portions of the buffer layer 203 disposed under the first and second sacrificial spacers SS1 and SS2 are also removed.

Thereafter, a dielectric layer 204 is formed on the semiconductor substrate 100 by a CVD process. The dielectric layer 204 may be made of, for example, silicon oxide. The dielectric layer 204 is formed on the lateral surfaces and the upper surface of the sacrificial vertical structure (SVS).

Figure 5:
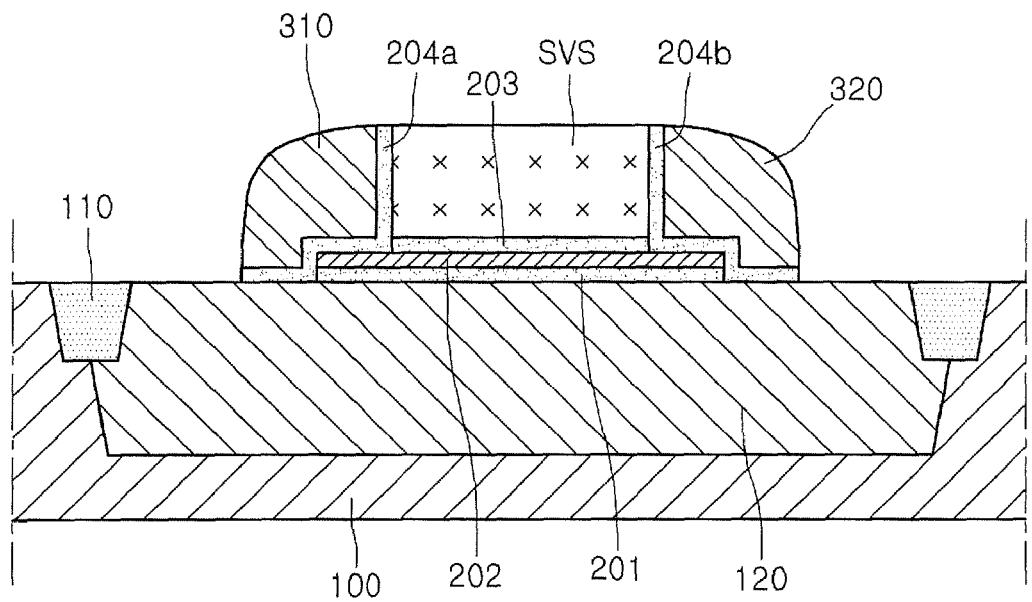

Referring to FIG. 5, a polysilicon layer is formed on the dielectric layer 204. The polysilicon layer is etched by an anisotropic etching process, such as an etch-back process, to form the first and second gate electrodes 310 and 320 on the lateral surfaces of the sacrificial vertical structure (SVS).

The first and second gate electrodes 310 and 320 are disposed on the nitride film 202 and are formed on the lateral surfaces of the nitride film 202. The first and second gate electrodes 310 and 320 are symmetrical with each other.

Moreover, the first and second gate electrodes 310 and 320 are formed by the anisotropic etching process so that they have substantially the same size.

Figure 6:
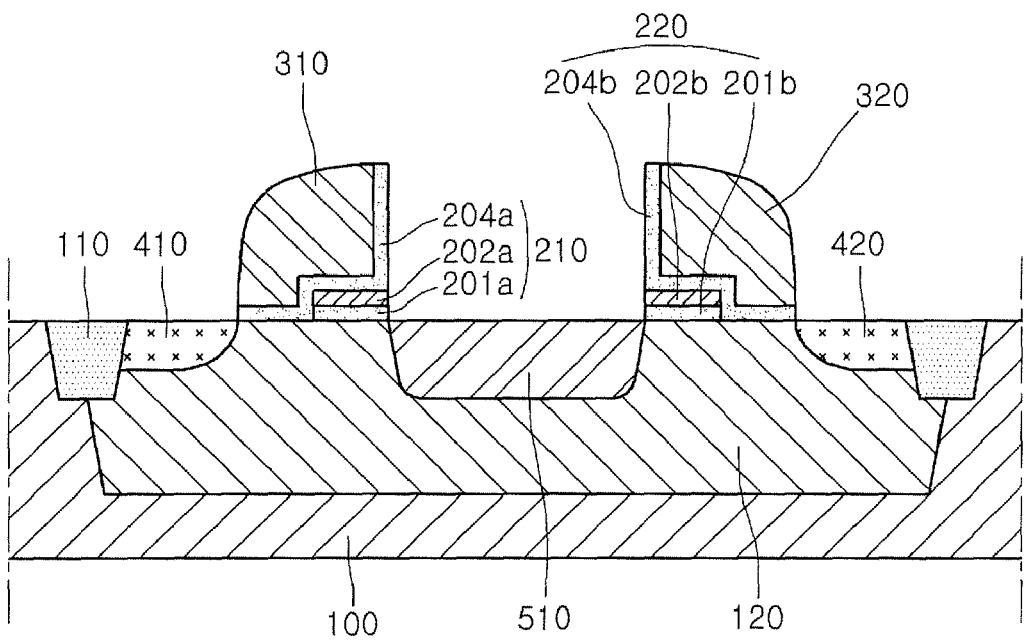

Referring to FIG. 6, after the first and second gate electrodes 310 and 320 are formed, the sacrificial vertical structure (SVS) is removed.

Thereafter, the buffer layer 203, the nitride film 202, and the tunnel oxide film 201 are etched using the first and second gate electrodes 310 and 320 as masks.

Accordingly, a first trap unit 210 that includes a first tunnel oxide film 201a, a first charge trap layer 202a, and a first dielectric layer 204a is formed on the semiconductor substrate 100. At the same time, a second trap unit 210 that includes a second tunnel oxide film 201b, a second charge trap layer 202b, and a second dielectric layer 204b is formed.

Thereafter, a low-concentration p-type impurity is implanted into the substrate at outer sides of the first and second gate electrodes 310 and 320, thereby forming LDD regions 410 and 420, and a high-concentration p-type impurity is implanted into the region between the second gate electrodes 310 and 320, thereby forming a source region 510.

Figure 7:
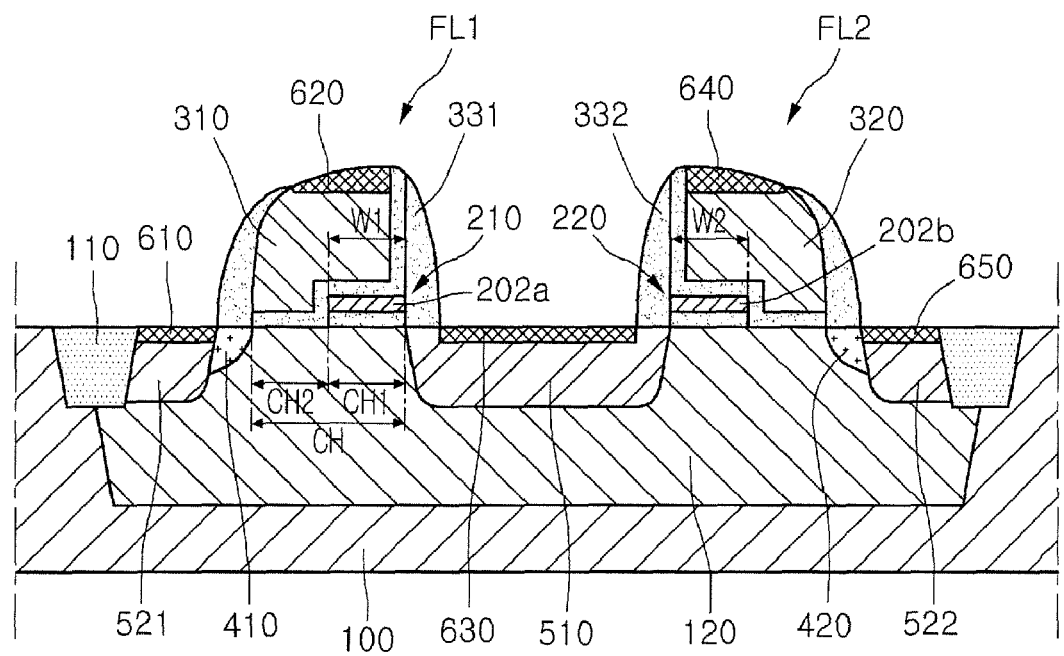

Referring to FIG. 7, after the source region 510 is formed, spacers 331 and 332 are formed on the lateral surfaces of the first and second gate electrodes 310 and 320. At this time, the spacers 331 and 332 are also disposed on lateral surfaces of the first and second charge trap layers 202a and 202b, thereby isolating the lateral surfaces of the first and second charge trap layers 202a and 202b.

Thereafter, high-concentration p-type impurity is implanted into at outer sides of the first and second gate electrodes 310 and 320, thereby forming drain regions 521 and 522.

Thereafter, silicide films 610, 620, 630, 640, and 650 are formed on the first and second gate electrodes 310 and 320, the source region 510, and the drain regions 521 and 522.

Thereby, a flash memory device that includes memory cells FL1 and FL2 being symmetrical with each other and having a SONOS structure is formed.

The first memory cell FL1 includes the first gate electrode 310 and the first trap unit 210.

The first trap unit 210 includes the first tunnel oxide film 201a, the first charge trap layer 202a, and the first dielectric layer 204a. The first tunnel oxide film 201a is interposed between the first charge trap layer 202a and the semiconductor substrate 100, and the first dielectric layer 204a is interposed between the first gate electrode 310 and the first charge trap layer 202a. In other words, the first trap unit 210 has an ONO structure.

The second memory cell FL2 includes the second gate electrode 320 and the second trap unit 220.

The second trap unit 220 includes the second tunnel oxide film 201b, the second charge trap layer 202b, and the second dielectric layer 204b. The second tunnel oxide film 201b is interposed between the second charge trap layer 202b and the semiconductor substrate 100, and the second dielectric layer 204b is interposed between the second gate electrode 320 and the second charge trap layer 202b. In the same manner, the second trap unit 220 has an ONO structure.

The first and second charge trap layers 202a and 202b may trap and hold charges. More specifically, the first and second charge trap layers 202a and 202b may trap and hold hot electrons and hot holes.

The first gate electrode 310 and the second gate electrode 320 have substantially the same size.

Further, the width W1 of the first charge trap layer 202a is substantially the same as the width of the first sacrificial spacer (SS1), and in the same manner, the width W2 of the second charge trap layer 202b is substantially the same as the width of the second sacrificial spacer (SS2).

Therefore, the width of the first charge trap layer 202a is substantially the same as the width of the second charge trap layer 202b.

The first and second gate electrodes 310 and 320 have the same size and the first and second charge trap layers 202b have the same size, such that the first memory cell FL1 and the second memory cell FL2 have substantially the same size.

Therefore, the flash memory device having the SONOS structure in accordance with embodiments of the present invention can reduce the deviation between the memory cells.

In particular, the flash memory device having the SONOS structure of an embodiment can reduce the deviation between the memory cells caused by the deviation in the widths of the charge trap layers.

Further, the first memory cell FL1 has a channel region CH that is partitioned into a first channel region CH1 and a second channel region CH2. The channel region CH is formed between the source region 510 and the drain region 521.

The first channel region CH1 corresponds to the first trap unit 210 and the second channel region CH2 is adjacent to the first channel region CH1.

More specifically, the first trap unit 210 is disposed on the first channel region CH1, while not being disposed on the second channel region CH2. In other words, the first trap unit 210 is disposed only on the first channel region CH1.

Accordingly, the first channel region CH1 and the second channel region CH2 are partitioned by the first trap unit 210.

The first gate electrode 310 is disposed on the first channel region CH1 and the second channel region CH2. In other words, the first gate electrode 310 is disposed on the first channel region CH1 and on the second channel region CH2, as well as on the first trap unit 210.

Moreover, the first gate electrode 310 covers a lateral surface of the first trap unit 210. In particular, the first gate electrode 310 covers a lateral surface of the first charge trap layer 202a.

The second memory cell FL2 also has the same structure as the first memory cell FL1. According to an embodiment, the second memory cell FL2 and the first memory cell FL1 can be symmetric about the source 510.

The first memory cell FL1 includes the first channel region CH1 and the second channel region CH2, thereby having a structure where one transistor is coupled with one memory cell.

Therefore, the flash memory device according to an embodiment can implement the improved integration.

In other words, the first channel region CH1 and the second channel region CH2 can be controlled by the first gate electrode 310.

Therefore, the first memory cell FL1 and the second memory cell FL2 have the function of a select transistor so that the flash memory device can reduce over-erase.

Figure 8:
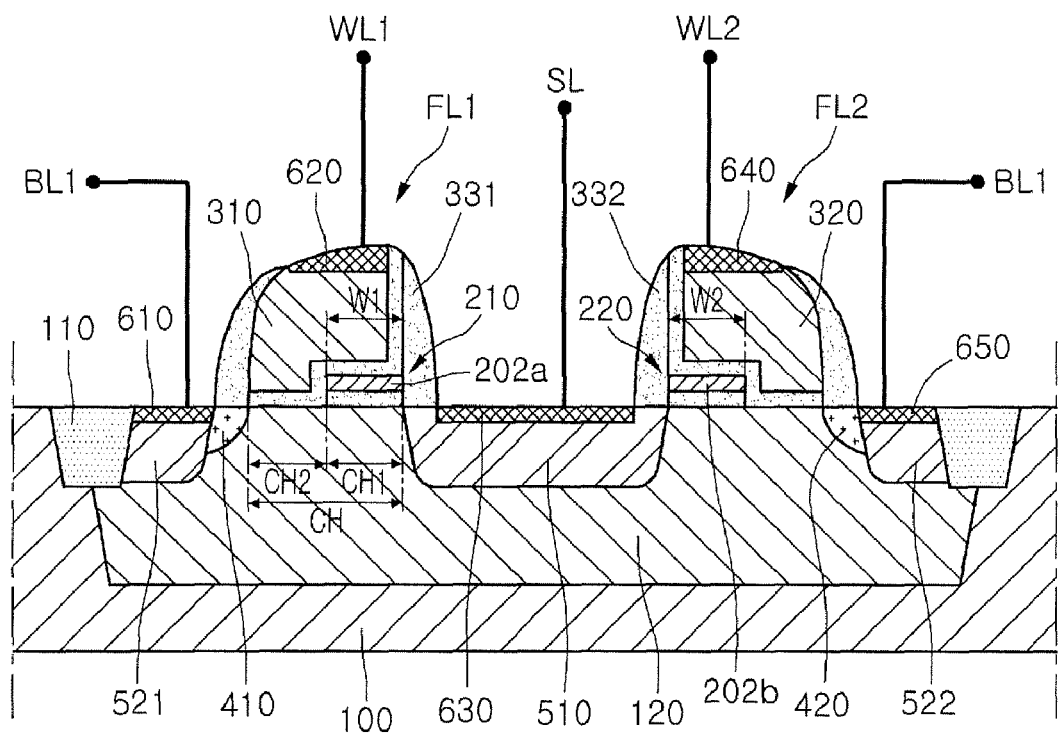
FIG. 8 is a diagram showing a flash memory device having a SONOS structure according to an embodiment.
Figure 9:
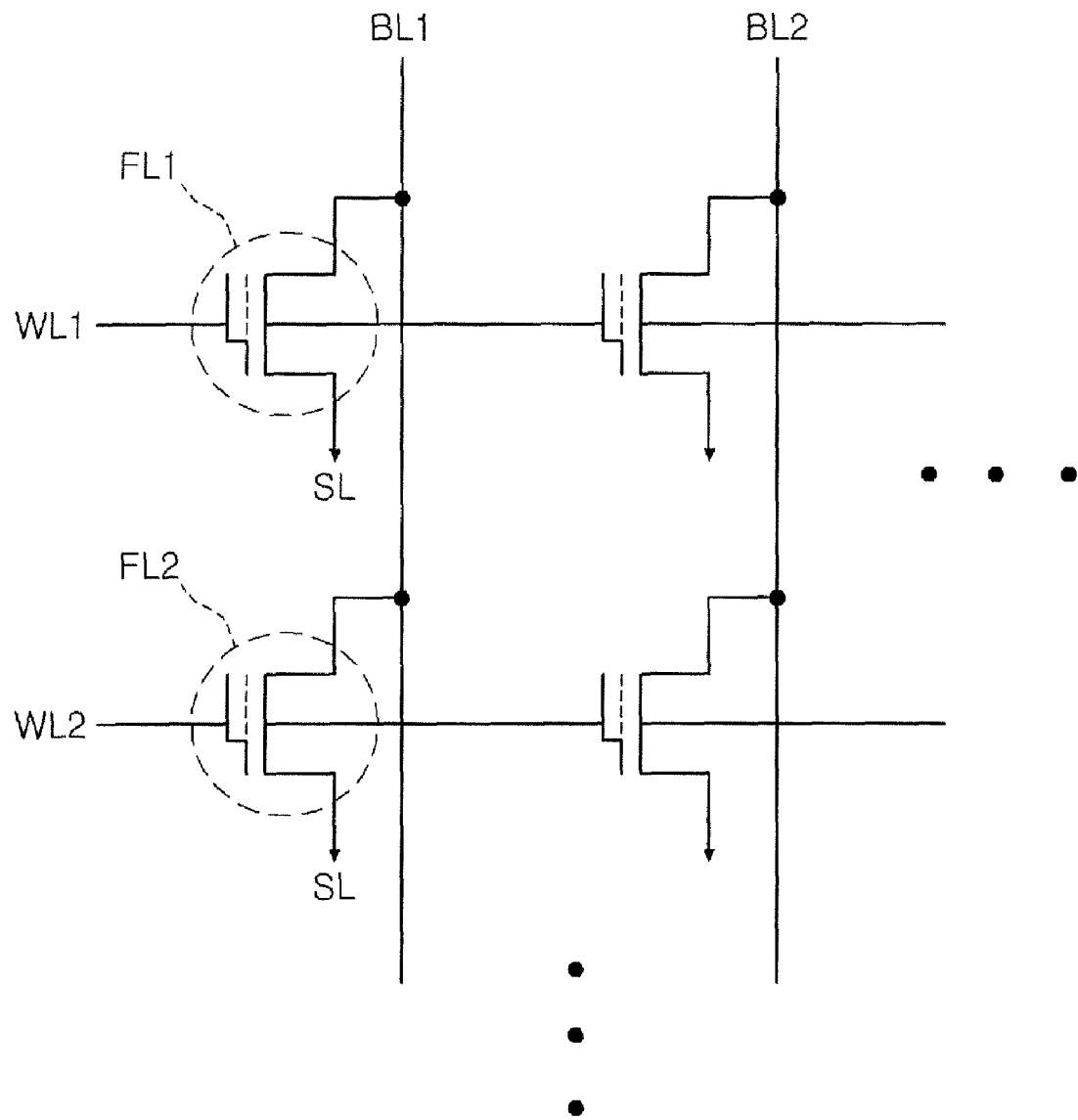
FIG. 9 is a circuit view of a flash memory device according to an embodiment.

FIG. 8 is a diagram showing a flash memory device having a SONOS structure according to an embodiment. FIG. 9 is a circuit view of a flash memory device according to an embodiment.

Referring to FIGS. 8 and 9, the flash memory device according to an embodiment ejects hot electrons and hot holes into the charge trap layers 202a and 20b to program and erase the memory cells FL1 and FL2.

In other words, the hot electrons are ejected into the charge trap layers 202a and 202b to lower the threshold voltage (Vth) of the channel region CH so that the memory cells FL1 and FL2 are programmed. Also, the hot holes are ejected into the charge trap layers 202a and 202b to remove the hot electrons so that the memory cells FL1 and FL2 are erased.

Further, the charge trap layer is not disposed on the second channel region CH2 so that the portion corresponding to the second channel region CH2 performs the function of the transistor.

The processes of programming, reading and erasing the first memory cell FL1 will be reviewed with reference to Table 1.

First, in order to program the first memory cell FL1, a high bias (VH) is applied to the first word line WL1 and the source region 510 (through SL), and a back bias (VB) is applied to the first bit line BL1.

Further, an inhibit bias (VI) is applied to other bit lines (e.g., BL2), and a reference voltage of, for example, 0 V is applied to the semiconductor substrate 100 and other word lines (e.g., WL2).

In other words, the high bias (VH) is applied to the first gate electrode 310 and the source region 510, the back bias (VB) is applied to the drain electrodes 521 and 522, and the reference voltage is applied to the second gate electrode 320.

The high bias (VH) may be in a range of about +9 to +11 V and the back bias VB may be in a range of about +1 to +2V. Also, the inhibit bias (VI) may be in a range of about 4 to 6 V or may be floating (FL).

By this biasing scheme, the hot electrons are ejected into the first trap layer 202a.

In order to read the first memory cell FL1, a driving bias (Vcc) is applied to the first word line WL1 and a read bias (Vread) is applied to the first bit line BL1. Also, the reference voltage is applied to the source region 510 (through SL) and the semiconductor substrate 100.

In other words, the driving bias (Vcc) is applied to the first gate electrode 310 and the read bias (Vread) is applied to the drain regions 521 and 522.

The driving bias (Vcc) can be in the range of about 3 to 7V and the read bias Vread can be in the range of about 0.3 to 1V.

In order to erase the first memory cell FL1, a low bias (VL) that is a negative voltage is applied to the first word line WL1 and a positive voltage of about 3 to 5V is applied to the source region 510. In one embodiment, a voltage of 4V can be applied to the source region.

Further, the reference voltage is applied to the semiconductor substrate 100, the reference voltage or the floating (FL) is applied to the bit lines, and the reference voltage is applied to other word lines.

In other words, the low bias (VL) is applied to the first gate electrode 310 and the reference voltage is applied to the second gate electrode 320.

The low bias VL can be in the range of about −7 to −9V.

In the same manner, the reference voltage or the floating (FL) is applied to the drain electrodes.

In the manner as described above, hot holes are injected into the first charge trap layer 202a so that the first memory cell FL1 is erased.

The erase process may be performed at a time for each page or sector, including a plurality of memory cells.

TABLE 1

| | WL1 | WL2 | BL1 | BL2 | Source region | Semiconductor substrate |
|---|---|---|---|---|---|---|
| Program | VH | 0 V | VB | VI | VH | 0 V |
| Read | Vcc | 0 V | Vread | 0 V | 0 V | 0 V |
| Erase | VL | 0 V | 0 V or FL | 0 V or FL | 4 V | 0 V |

As reviewed above, the flash memory device according to the embodiment can program and erase the memory cells by ejecting the hot electrons and the hot holes into the charge trap unit.

Therefore, the flash memory device according to the embodiment can be driven in a NOR form and thus can be highly integrated.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, comprising:
   forming a nitride film on a semiconductor substrate;
   forming a sacrificial vertical structure on the nitride film;
   forming sacrificial spacers on lateral surfaces of the sacrificial vertical structure;
   performing an initial patterning of the nitride film using the sacrificial vertical structure and the sacrificial spacers as etch masks;
   removing the sacrificial spacers from the initially patterned nitride film and forming gate electrodes on the lateral surfaces of the sacrificial vertical structure; and
   removing the sacrificial vertical structure from between the gate electrodes and performing a second patterning the nitride film using the gate electrodes as etch masks.

2. The method of fabricating the semiconductor device according to claim 1, wherein the gate electrodes are formed by covering the initially patterned nitride film, including outer lateral sides of the initially patterned nitride film.

3. The method of fabricating the semiconductor device according to claim 1, wherein the forming of the sacrificial spacers on the lateral surfaces of the sacrificial vertical structure comprises:
   forming a sacrificial spacer material layer on the semiconductor substrate, covering the sacrificial vertical structure; and
   anisotropically etching the sacrificial spacer material layer to form the sacrificial spacers.

4. The method of fabricating the semiconductor device according to claim 1, further comprising:
   forming a first oxide film on the semiconductor substrate before forming the nitride film on the substrate, wherein the nitride film is formed on the first oxide film; and
   forming a second oxide film on the nitride film before forming the sacrificial vertical structure on the nitride film, wherein the sacrificial vertical structure is formed on the second oxide film.

5. The method of fabricating the semiconductor device according to claim 4, wherein the removing of the sacrificial spacers comprises removing a portion of the second oxide film.

6. The method of fabricating the semiconductor device according to claim 1, further comprising, after removing the sacrificial spacers:
   forming a dielectric layer on the semiconductor substrate and the initially patterned nitride film before forming the gate electrodes on the lateral surfaces of the sacrificial vertical structure.

* * * * *